US009696350B2

(12) United States Patent
Burton et al.

(10) Patent No.: US 9,696,350 B2
(45) Date of Patent: Jul. 4, 2017

(54) NON-LINEAR CONTROL FOR VOLTAGE REGULATOR

(71) Applicant: INTEL CORPORATION, Santa Clara, CA (US)

(72) Inventors: Edward A. Burton, Hillsboro, OR (US); Gerhard Schrom, Hillsboro, OR (US); Michael W. Rogers, Hillsboro, OR (US); Alexander Lyakhov, Haifa (IL); Ravi Sankar Vunnam, Hillsboro, OR (US); Jonathan P. Douglas, Portland, OR (US); Fabrice Paillet, Hillsboro, OR (US); J. Keith Hodgson, Hillsboro, OR (US); William Dawson Kesling, Davis, CA (US); Chiu Keung Tang, Folsom, CA (US); Narayanan Raghuraman, Beaverton, OR (US); Narayanan Natarajan, Bangalore (IN); Samie Samaan, West Linn, OR (US); George Geannopoulos, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 410 days.

(21) Appl. No.: 13/907,802

(22) Filed: May 31, 2013

(65) Prior Publication Data
US 2014/0266119 A1 Sep. 18, 2014

Related U.S. Application Data

(60) Provisional application No. 61/799,833, filed on Mar. 15, 2013, provisional application No. 61/829,992, filed on May 31, 2013.

(51) Int. Cl.
*H02M 3/157* (2006.01)
*G01R 19/00* (2006.01)
(Continued)

(52) U.S. Cl.
CPC ............ *G01R 19/0092* (2013.01); *G06T 3/40* (2013.01); *H02M 1/088* (2013.01); *H02M 3/156* (2013.01);
(Continued)

(58) Field of Classification Search
CPC .............. H02M 3/157; H02M 3/156; H02M 2003/1566; H02M 3/158; H02M 1/088;
(Continued)

(56) References Cited

U.S. PATENT DOCUMENTS 5,963,439 A 10/1999 Wuidart et al.
7,274,181 B2 9/2007 Schrom et al.
(Continued)

OTHER PUBLICATIONS

English translation of Office Action from foreign counterpart German Patent Application No. 102014003670.7, mailed Dec. 2, 2014, 3 pages.
(Continued)

*Primary Examiner* — Gustavo Rosario Benitez
(74) *Attorney, Agent, or Firm* — Blakely, Sokoloff, Taylor & Zafman LLP

(57) ABSTRACT

Described is an apparatus having a non-linear control to manage power supply droop at an output of a voltage regulator. The apparatus comprises: a first inductor for coupling to a load; a capacitor, coupled to the first inductor, and for coupling to the load; a first high-side switch couple to the first inductor; a first low-side switch coupled to the first inductor; a bridge controller to control when to turn on and off the first high-side and first low-side switches; and a non-linear control (NLC) unit to monitor output voltage on the load, and to cause the bridge controller to turn on the first high-side switch and turn off the first low-side switch when a voltage droop is detected on the load.

22 Claims, 10 Drawing Sheets

(51) Int. Cl.
*H03L 5/00* (2006.01)
*H03M 1/66* (2006.01)
*G06T 3/40* (2006.01)
*H02M 3/156* (2006.01)
*H02M 1/088* (2006.01)
*H02M 3/158* (2006.01)
*H03M 1/68* (2006.01)
*H02M 1/00* (2006.01)

(52) U.S. Cl.
CPC ........... *H02M 3/157* (2013.01); *H02M 3/158* (2013.01); *H03L 5/00* (2013.01); *H03M 1/66* (2013.01); *H02M 2001/0009* (2013.01); *H02M 2003/1566* (2013.01); *H03M 1/685* (2013.01)

(58) Field of Classification Search
CPC ......... H03L 5/00; G01R 19/0092; G06T 3/40; H03M 1/66; H03M 1/685
USPC .................................................. 323/282–284
See application file for complete search history.

(56) References Cited

U.S. PATENT DOCUMENTS

| | | | | |
|---|---|---|---|---|
| 7,615,982 | B1* | 11/2009 | Guo | .................... H02M 3/1584 323/271 |
| 7,764,054 | B1* | 7/2010 | Guo et al. | ...................... 323/224 |
| 7,863,875 | B1* | 1/2011 | Guo | .................... H02M 3/1584 323/275 |
| 2003/0031036 | A1 | 2/2003 | Kates | |
| 2003/0034762 | A1 | 2/2003 | Tateishi | |
| 2003/0223255 | A1* | 12/2003 | Ben-Yaakov | ....... H02M 1/4225 363/89 |
| 2004/0051510 | A1 | 3/2004 | Saggini et al. | |
| 2004/0076026 | A1 | 4/2004 | Dinh et al. | |
| 2005/0286280 | A1 | 12/2005 | Schrom et al. | |
| 2006/0114550 | A1* | 6/2006 | Ricketts et al. | .............. 359/330 |
| 2007/0024252 | A1* | 2/2007 | Marino et al. | ................. 323/222 |
| 2007/0096703 | A1 | 5/2007 | Jain | |
| 2007/0108953 | A1 | 5/2007 | Latham | |
| 2007/0210777 | A1 | 9/2007 | Cervera et al. | |
| 2009/0174262 | A1* | 7/2009 | Martin et al. | ................... 307/82 |
| 2009/0310385 | A1* | 12/2009 | Maksimovic | ......... H02M 3/157 363/21.1 |
| 2010/0270989 | A1* | 10/2010 | Sasaki | ................... H02M 3/157 323/282 |
| 2010/0308654 | A1* | 12/2010 | Chen | ............................. 307/31 |
| 2011/0062929 | A1* | 3/2011 | Strydom | ............... H02M 3/158 323/284 |
| 2011/0298439 | A1* | 12/2011 | Ng et al. | ........................ 323/283 |
| 2012/0043946 | A1* | 2/2012 | Dong | .................... H02M 3/156 323/234 |
| 2012/0161740 | A1* | 6/2012 | Vogman | ........................ 323/286 |
| 2012/0262140 | A1* | 10/2012 | Divan | ........................... 323/282 |
| 2013/0049715 | A1* | 2/2013 | Groom | .................. H02M 3/156 323/271 |
| 2015/0145486 | A1* | 5/2015 | Bizjak | ..................... H02M 3/04 323/234 |

OTHER PUBLICATIONS

Korea Appln. No. 102121370 Office Action, Jun. 3, 2015, 10 pgs.
English translation of the allowed claims of counterpart Korean Patent Application No. 10-2014-0030644, mailed Aug. 17, 2015, 4 pages.

* cited by examiner

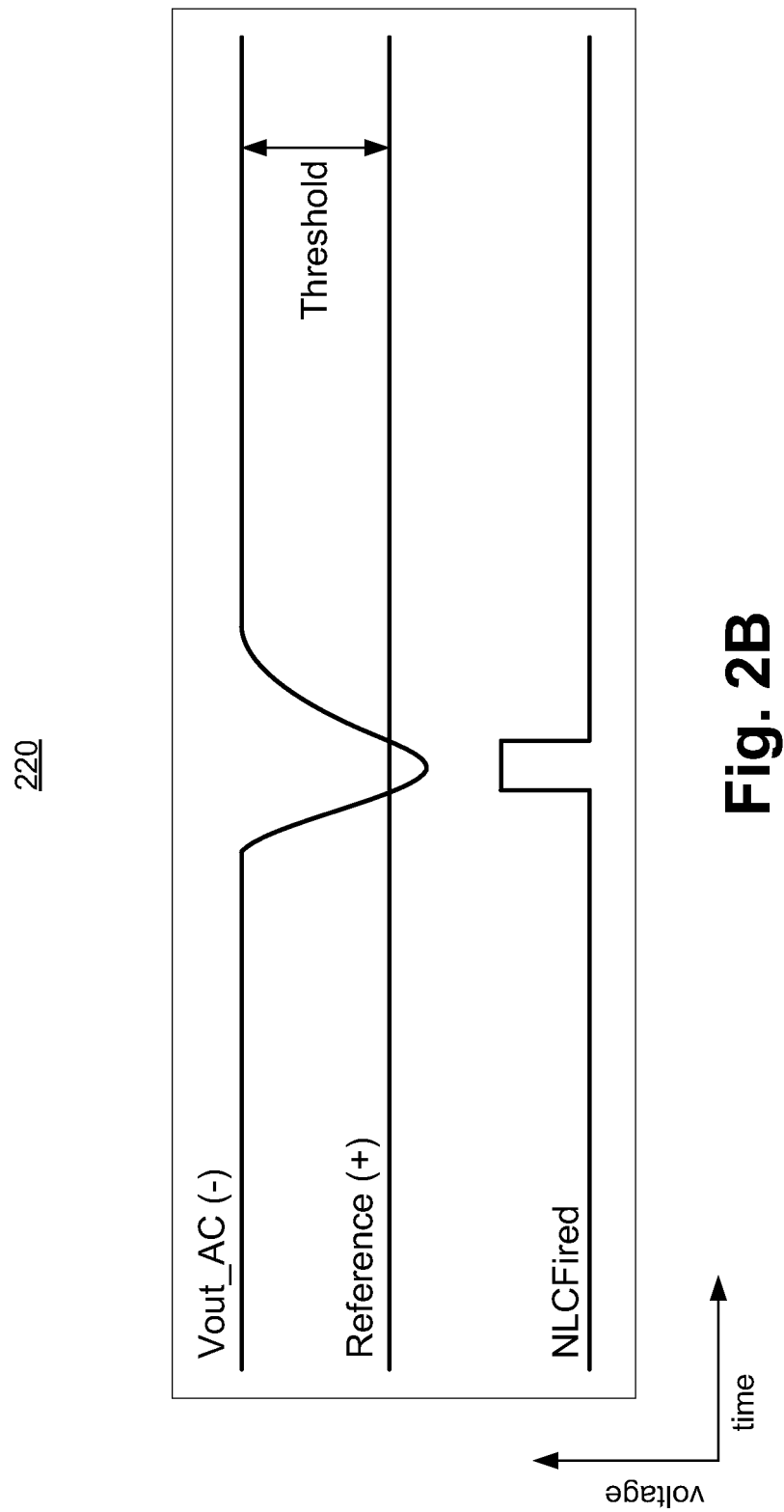

NON-LINEAR CONTROL FOR VOLTAGE REGULATOR

CLAIM OF PRIORITY

This application claims the benefit of priority of U.S. Provisional Application, 61/799,833 filed Mar. 15, 2013, titled "Integrated Voltage Regulators," and U.S. Provisional Application, 61/829,992 filed May 31, 2013, titled "On-Chip Compensator for an Integrated Voltage Regulator," which are incorporated by reference in their entirety.

BACKGROUND

Finite inductance and limited output decoupling capacitance in a DC-DC power converter (e.g., buck converter) may cause the output voltage of the converter to droop (e.g., by 200 mV) when the current suddenly increases i.e., when load suddenly demands more current. For example, when a processor core supply suddenly demands more power resulting in di/dt, power supply level may droop. For a DC-DC power converter providing power to low-power products (e.g., smart phones, tablets, etc.) higher light-load efficiency is targeted, which requires higher inductance, whereas voltage droop control requires lower inductance.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2B are waveforms illustrating operation of the NLC unit for AC coupling of output voltage, according to one embodiment of the disclosure.

DETAILED DESCRIPTION

Figure 1:
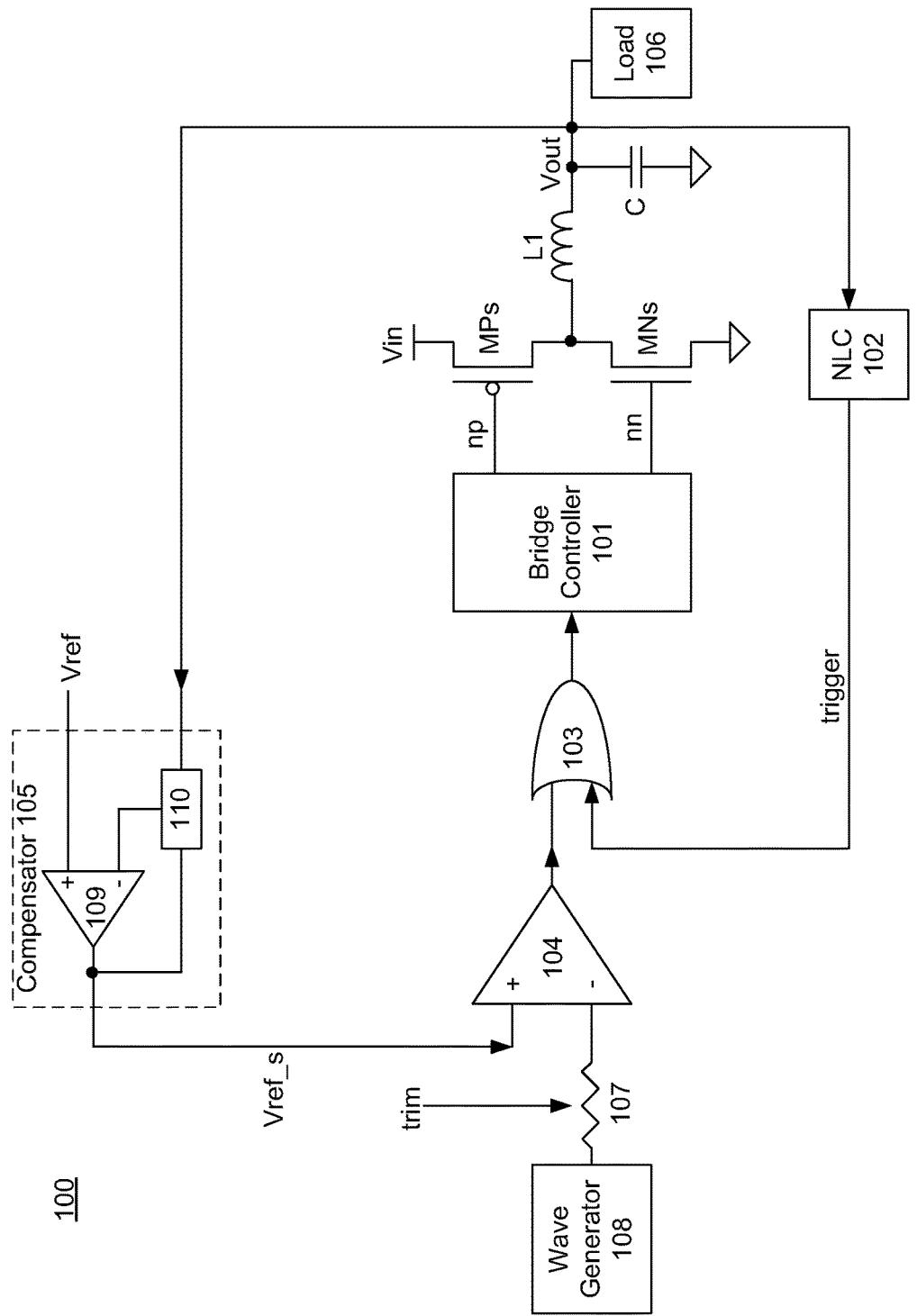
FIG. 1 is a switching voltage regulator (VR) with non-linear control (NLC) unit for voltage droop management, according to one embodiment of the disclosure.

The embodiments circumvent the fundamental trade-off discussed in the background section and achieve a much lower voltage droop and/or power loss. In one embodiment, a separate signal path with a fast droop detector to bypass and override the main voltage regulator (VR) loop path (including the sense line, compensator, Pulse Width Modulator (PWM), signaling to the power train, etc. is used to implement a non-linear control (NLC), which can reduce the voltage droop significantly. The voltage droop here refers to the droop on output voltage being supplied by the VR to a load.

In one embodiment, a separate power train (e.g., bridge controller and bridge) is provided which operates as a clamp with a direct low-inductance coupling to the VR output to bypass the main inductor(s) to overcome the limitation $di/dt < (Vin-Vout)/L$, where Vin is the input voltage to the VR, Vout is the output voltage of the VR provided to the load, and L is the inductance of the main inductor of the VR.

In one embodiment, when a voltage droop is detected on the output node of the VR (which is coupled to the load), the main control loop is bypassed and the high-side switch is forced to turn on. In one embodiment, when the main control loop is bypassed, the low-side switch of the VR bridge is forced to turn off. In this embodiment, the control loop is sped up. In one embodiment, a clamp which is formed by a smaller sized bridge with lower inductance than the VR main bridge and inductor. In such an embodiment, the clamp is turned on when a voltage droop is detected. In such an embodiment, voltage reference to the VR comparator (which compares a PWM wave with a reference voltage to generate control signal for the VR main bridge) is adjusted to stabilize the output voltage when the clamp is turned off. In one embodiment, the duration of clamping is adjusted by adjusting pulse width of the signal indicating voltage droop. In one embodiment, processor architecture is able to predict load voltage/current demand. In such an embodiment, the NLC engages proactively to reduce the impact of the droop before the droop actually occurs.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is an apparatus having part of a switching voltage regulator (VR) 100 with non-linear control (NLC) unit for voltage droop management, according to one embodiment of the disclosure. In one embodiment, apparatus 100 comprises a Bridge Controller 101, high-side switch(es) MPs, low-side switch(es) MNs, main inductor L1, load capacitor C, NLC unit 102, Override logic 103, Comparator 104, Compensator 105, Load 106, circuit 107 for trimming modulated wave, and Wave Generator 108.

In one embodiment Bridge Controller 101 controls when to turn on and/or off high-side and low-side switches (MPs and MNs) via gate control signals np and nn respectively. In one embodiment, low-side switch is replaced with a diode. In normal operation of voltage regulation, Bridge Controller 101 receives output of Comparator 104 to determine when to turn on and/or off high-side and low-side switches (MPs and MNs).

For example, Comparator 104 compares a modulated wave generated by Wave Generator 108 with a reference voltage (e.g., Vref_s) to generate switching signal, the switching signal indicating when the modulated wave is above and below reference voltage Vref_s. In normal operation, Override logic 103 behaves like a buffer and passes on the output of Comparator 104 to Bridge Controller 101. The term "normal operation" generally refers to stable voltage and current draw by load 106 i.e., when output voltage is not drooping. Normal operation is different from voltage droop situation when Load 106 suddenly draws more current causing voltage Vout to droop.

In one embodiment, high-side switch MPs and low-side switch MNs form the bridge of the voltage regulator. In one embodiment, the low-side switch MNs is replaced with a diode. In such an embodiment, Bridge Controller 101 effectively controls the output voltage by turning on/off high-side switch MPs. In one embodiment, the bridge receives input supply voltage Vin and generates a regulated output voltage Vout for Load 106. In one embodiment, the switching of current through main inductor L1 and charging/discharging of capacitor C by the bridge keeps Vout stable.

In one embodiment, when voltage droop occurs on Vout, NLC unit 102 detects voltage droop relative to a reference voltage and generates a trigger signal (also referred as NLCFired signal). In one embodiment, assertion of the trigger signal engages Override logic 103 to bypass output of Comparator 104 and directly control Bridge Controller 101. In one embodiment, Override logic 103 is coupled to comparator 104 and Bridge Controller 101. In one embodiment, Override logic 103 performs an OR logic function on outputs of Comparator 104 and trigger signal. In one embodiment, override logic 103 is an OR gate. In other embodiments, Override logic 103 is any logic gate which is operable to override output of Comparator 104 in response to assertion of the trigger signal.

In one embodiment, when trigger signal is asserted (i.e., when voltage droop on Vout is detected by NLC unit 102), high-side switch MPs is turned on and low-side switch MNs is turned off. In one embodiment, trigger signal is a pulse signal having a pulse width indicative of the duration of the voltage droop. In one embodiment, pulse width of trigger signal is adjustable by a Pulse Adjuster (not shown). In such an embodiment, high-side switch MPs is turned on and low-side switch MNs is turned off for the duration of the pulse width of the trigger signal. In one embodiment, when trigger signal de-asserts, Override logic 103 allows output of Comparator 104 to continue control of Bridge Controller 101. In one embodiment, NLC unit 102 is Alternating Current (AC) coupled to Vout to generate trigger signal.

In one embodiment, output voltage Vout is received by Compensator 105. In one embodiment, Compensator 105 scales reference voltage Vref as Vref_s for Comparator 104. In one embodiment, Compensator 105 comprises a Comparator 109 coupled to passive devices 110 as shown. In one embodiment, passive devices 110 receive output voltage Vout. In one embodiment, Compensator 105 adjusts Vref_s in response to voltage droop on Vout so that when droop ends and Override logic 103 allows output of Comparator 104 to control Bridge Controller 101, Vout achieves its normal voltage level as stably as possible.

In one embodiment, Compensator 105 provides feedback and a transfer function necessary to stabilize the VR system such that nominally Vout is substantially equal to Vref while accounting for steady state load and low-frequency transient load conditions. In one embodiment, the transfer function of Compensator 105 is used to optimally tune the VR loop's transfer function.

In one embodiment, Wave Generator 108 generates a triangular wave for Comparator 104. The output of Comparator 104 is a pulse width modulated (PWM) signal. In one embodiment, circuit 107 is used for trimming the triangular wave. In one embodiment, circuit 107 is used to trim out offset of Comparator 104. In one embodiment, circuit 107 is used to achieve phase current balancing for multi-phase buck VRs. In one embodiment, current is injected or sunk to/from various tap points on a potentiometer (i.e., adjustable resistor); this shifts the average output voltage from Wave Generator 108 seen at Comparator 104.

So as not to obscure the embodiment of FIG. 1, one Bridge Controller 101, one set of high-side and low-side switches (MPs and MNs), and one main inductor L1 is shown. However, the embodiments can operate with a plurality of bridge controllers each of which controls its own set of bridges (i.e., high-side and low-side switches) coupled to its own inductor or to the main inductor L1 i.e., a multi-phase buck VR. In such an embodiment, a plurality of comparators is used such that each comparator drives a bridge instance or "phase." In one embodiment, output of each comparator of the plurality of comparators 104 is received by override logic 103 which is used to override output of the comparators when voltage droop is detected by NLC 102. In such an embodiment, all bridge controllers turn on their respective high-side switches and turn off their low-side switches during voltage droop on Vout. In this embodiment, Wave Generator 108 generates a plurality of waves that are substantially identical except for phase offset. In one embodiment, each phase is trimmed separately via circuit 107.

In one embodiment, during low power mode operation of apparatus 100 having multi-phase bridge drivers where some of the phases are off to save power (i.e., those bridges are not driving) while some phases are on to generate Vout with low current demand, when a voltage droop on Vout is detected by NLC unit 102, the bridges which are off (to save power) are forcefully turned on by the Override logic 103 to mitigate the voltage droop effect. In one embodiment, not all bridges which were off are forcefully turned on, but phases (i.e., bridges to generate the phases) which are already enabled are forcefully turned on.

Figure 2A:
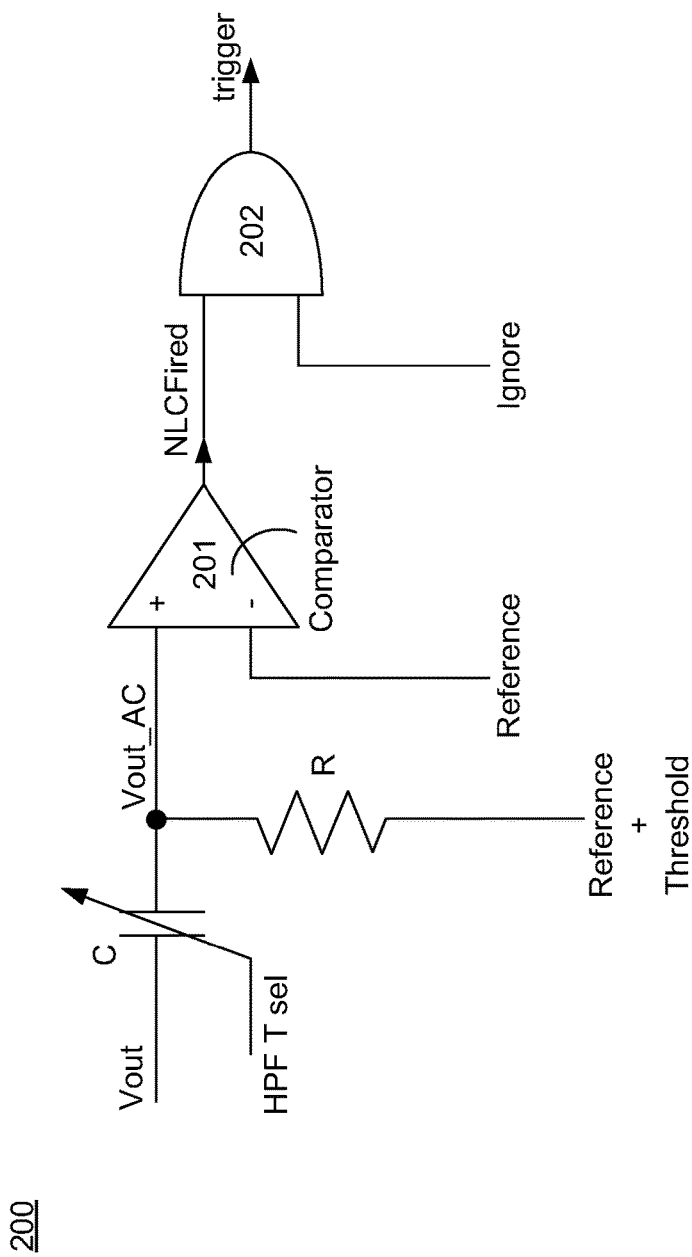
FIG. 2A is an NLC unit for Alternating Current (AC) coupling of output voltage, according to one embodiment of the disclosure.

FIG. 2A is an NLC unit 200 (e.g., 102) with AC coupled output voltage, according to one embodiment of the disclosure. It is pointed out that those elements of FIG. 2A having the same reference numbers (or names) as the elements of any other figure can operate or function in any manner similar to that described, but are not limited to such.

In one embodiment, NLC unit 200 comprises a high-pass filter (HPF) formed from capacitor C and resistor R as shown, Comparator 201, and Bypass Unit 202. In one embodiment, capacitor C is coupled to output node of VR apparatus 100 providing Vout to Load 106. In such an embodiment, capacitor C AC couples output node of VR apparatus 100 to input Vout_AC of Comparator 201. In one embodiment, resistor R is coupled at one end to capacitor C and biased by Reference voltage or Reference voltage plus Threshold at the other end. In one embodiment, Reference voltage is the level at which comparator 201 identifies whether voltage droop occurred on output node providing Vout.

With an AC-coupled design, the Reference voltage can be set to be the DC common-mode voltage at which Comparator 201 performs best i.e., Comparator 201 exhibits shortest delay from signal at Vn crossing signal at Vp (where Vn and Vp are negative and positive input terminals of Comparator 201) to the output transition. In another embodiment, the best performance of Comparator 201 may be gauged by other parameters, for example, bias current. The term "Threshold" refers generally to a DC voltage that sets the minimum droop magnitude that generates a NLC trigger. For Vout droops, ripple, or noise with amplitudes smaller than the Threshold, the droop detector (e.g., NLC 102) should not trigger. In one embodiment, the Threshold is configurable via software or fuses.

In one embodiment, output of comparator 201 is received by Bypass Unit 202. In one embodiment, Bypass Unit 202 is optional. In one embodiment, Bypass Unit 202 is used to bypass the output of Comparator 201 via Ignore signal so that trigger signal does not cause override logic 103 to override. For example, when Ignore is logical low, trigger is logical low causing Override logic 103 to buffer output of Comparator 104 to Bridge Controller 101. In one embodiment, Bypass Unit 202 is an AND gate. In other embodiments, other logic units may be used to implement Bypass Unit 202.

In one embodiment, NLC unit 200 further comprises a multiplexer or logic (not shown) to override the output of comparator 201 and/or Bypass Unit (or logic) 202. In such an embodiment, output from another logic (or external pin) indicating that voltage droop on Vout is about to occur is used to generate the trigger signal for voltage droop management. For example, a Prediction logic (not shown) may predict or anticipate current demand increase by Load 106, and provide a signal to the multiplexer or logic to override output of Comparator 201 and/or Bypass Unit 202. In such an embodiment, Bridge Controller 101 is forced to turn on high-side switch MPs prior to voltage droop on Vout or just about when voltage droop on Vout is about to occur. This proactive voltage droop management may cause overshoot on output voltage Vout (because high-side switch MPs is forcefully turned on), which is less disruptive to operation of circuits of Load 106 than voltage droop on output voltage Vout.

In one embodiment, time constant (i.e., T=RC) determines the bandwidth of the HPF. At frequencies below $1/(2\pi T)$, AC characteristics of Vout are filtered by the HPF. At those frequencies, magnitude of transfer function 'H' (or gain) of NLC unit 200 substantially approaches zero. For example, when the filter characteristics roll off over a decade or so, the magnitude of 'H' substantially approaches zero. At frequencies higher than $1/(2\pi T)$, AC characteristics of Vout are coupled to input (Vout_AC) of comparator 201. As frequency reduces (i.e., less than $1/(2\pi T)$), more of AC characteristics of Vout are coupled to input (Vout_AC) of comparator 201. In one embodiment, capacitance of capacitor C is programmable (via HPF T sel signal) to adjust the time constant of HPF. In one embodiment, HPF T sel signal is generated by fuse. In other embodiments, HPF T sel signal is programmable by software.

FIG. 2B are waveforms 220 illustrating operation of the NLC unit 200 with AC coupling of output voltage, according to one embodiment of the disclosure. It is pointed out that those elements of FIG. 2B having the same reference numbers (or names) as the elements of any other figure can operate or function in any manner similar to that described, but are not limited to such.

For waveforms 220, x-axis is time and y-axis is voltage. The first waveform from the top is Vout_AC which is the AC component of Vout. The term node and voltage on that node are interchangeably used. For example, Vout signal and node Vout are interchangeably used and generally refer to actual node or signal on that node, depending on the context of the description. Vout_AC is coupled to negative terminal of Comparator 201. The second waveform from the top is Reference signal which is received by the positive terminal of Comparator 201. The last signal from the top is NLCFired which is the pulse generated by Comparator 201 when voltage droop on Vout_AC crosses Reference voltage level. The DC voltage offset between Vout_AC and Reference is the Threshold.

Figure 3:
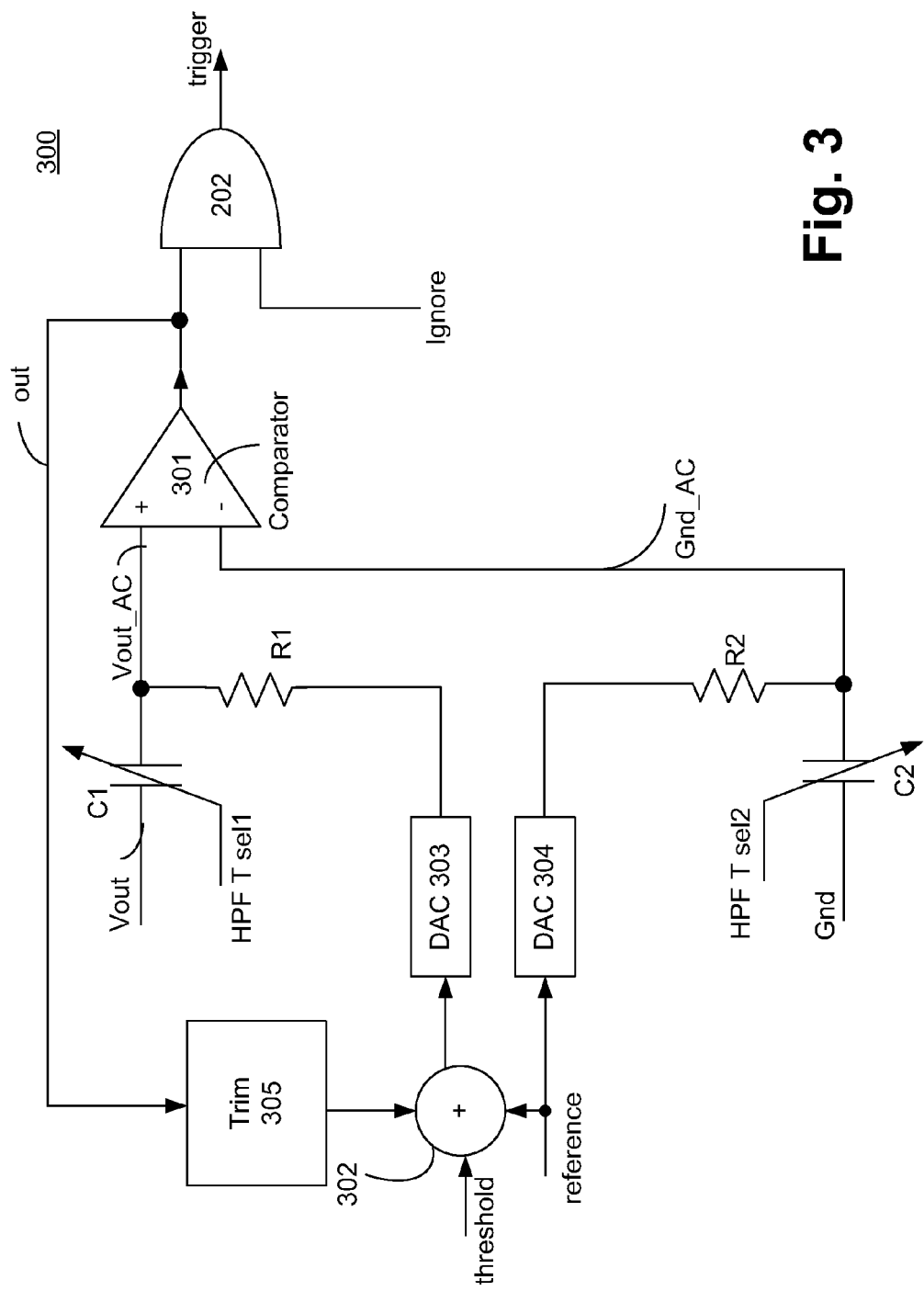
FIG. 3 is an NLC unit with differential AC coupling of output voltage, according to one embodiment of the disclosure.

FIG. 3 is an NLC unit 300 (e.g., 200 and 102) with differential AC coupling, according to one embodiment of the disclosure. It is pointed out that those elements of FIG. 3 having the same reference numbers (or names) as the elements of any other figure can operate or function in any manner similar to that described, but are not limited to such.

In one embodiment, NLC 300 comprises Comparator 301, Adder 302, digital to analog converter (DAC) 303, DAC 304, and Trim logic 305. In this embodiment, both Vout and ground (Gnd) are AC coupled to inputs of Comparator 301 (which otherwise is similar to Comparator 201). In one embodiment, the ground node is the ground node at Load 106 because at high load di/dt, the ground node at Load 106 may not be equal to the ground node at the Bridge Controller 101. In one embodiment, two HPFs (first HPF and second HPF) are used to generate the AC coupled inputs for Comparator 301. One technical effect of NLC unit 300 is that NLC unit 300 exhibits double signal to noise ratio (SNR) compared to NLC unit 200 because ground noise (e.g., at Load 106) is also modeled in the decision process of generating trigger signal.

In one embodiment, first HPF comprises capacitor C1 and resistor R2 which are used to AC couple Vout to Vout_AC. In this embodiment, time constant T1=C1×R1 determines the cut off frequency of the first HPF. In one embodiment, capacitor C1 provides phase lead to improve stability of the control loop. In one embodiment, T1 is 1.5 ns to 6.5 ns. In other embodiments, other time constants may be used for first HPF. In one embodiment, capacitance of C1 is programmable by HPF T sel1 signal. In one embodiment, HPF T sel1 signal is generated by fuse. In other embodiments, HPF T sel1 signal is programmable by software. In one embodiment, one terminal of resistor R1 is coupled to Vout_AC and the other terminal of resistor R1 is coupled to DAC 303.

In one embodiment, DAC 303 converts threshold bits to an analog representation. In one embodiment, Adder 302 adds offset trim values of Comparator 301 with threshold bits and fixed reference code bits to provide digital input for DAC 303. The term "trim" generally refers to adjusting resistance and/or capacitance of resistors and/or capacitors to achieve the target resistance and/or capacitance which otherwise was not achieved due to process and/or temperature variations. The term "trim" may also refer to substantially eliminating offset of a comparator.

In one embodiment, there are two trims utilized by Bridge Controller 101 and NLC units. In one embodiment, the circuit/trim system is the compensator RC passives trim. In one embodiment, the other system is a comparator offset trim. In one embodiment, the digital input for DAC 303 sets the common mode (CM) for Comparator 301 plus threshold and offset trim. In one embodiment, fixed reference code bits, which are also received by DAC 304, set the CM for Comparator 301. In one embodiment, Adder 302 is a digital adder.

In one embodiment, the resistors and capacitors of first and second HPFs (i.e., R1, R2, C1 , and C2) are trimmed by Trim logic 305 according to output out of Comparator 301. In one embodiment, trim code used for trimming passive devices such as resistors and capacitors to compensate for process variation are determined by another trim logic different from Trim logic 305. In one embodiment, Trim logic 305 operates to reduce offset of Comparator 301 to substantially zero. In one embodiment, an FSM (finite state machine) monitors for a transition at output out of Comparator 301 while sweeping through trim codes (output of Trim logic 305). In one embodiment, a linear search algorithm is used where the FSM stops when output out of Comparator 301 transitions and saves the last trim code. In one embodiment, successive approximation is used to find the optimal trim code that results in least offset for Comparator 301. In one embodiment, four trim bits are used with 8 mV increments. In one embodiment, threshold bits are 5 bits in 8 mV increments. In other embodiments, other number of bits and granularity may be used.

In one embodiment, second HPF comprises capacitor C2 and resistor R2 which are used to AC couple Gnd to Gnd_AC. In this embodiment, time constant T2=C2 ×R2 determines the cut off frequency of the second HPF. In one embodiment, T2 is 1.5 ns to 6.5 ns. In other embodiments, other time constants may be used for second HPF. In one embodiment, capacitance of C2 is programmable by HPF T sel2 signal. In one embodiment, the second HPF is implemented as an identical copy to first HPF to optimally match time constants. In one embodiment, HPF T sel2 signal is generated by fuse. In other embodiments, HPF T sel2 signal is programmable by software. In one embodiment, one terminal of resistor R2 is coupled to Gnd_AC and the other terminal of resistor R2 is coupled to DAC 304. In one embodiment, DAC 304 converts fixed reference code bits to analog representation. In one embodiment, the digital input for DAC 304 sets the CM for Comparator 301.

In one embodiment, NLC unit 300 further comprises a multiplexer or logic (not shown) to override the output of comparator 201 and/or bypass logic 202. In such an embodiment, output from another logic (or external pin) indicating that voltage droop on Vout is about to occur is used to generate the trigger signal for voltage droop management. For example, a prediction logic (not shown) may predict or anticipate current demand increase by Load 106, and provide a signal to the multiplexer or logic to override output of Comparator 201 and/or Bypass Unit 202. In such an embodiment, Bridge Controller 101 is formed to turn on high-side switch MPs prior to voltage droop on Vout or just about when voltage droop on Vout is about to occur. This proactive voltage droop management may cause overshoot on output voltage Vout (because high-side switch MPs is forcefully turned on), which is less disruptive to operation of circuits of Load 106 than voltage droop on output voltage Vout.

Figure 4:
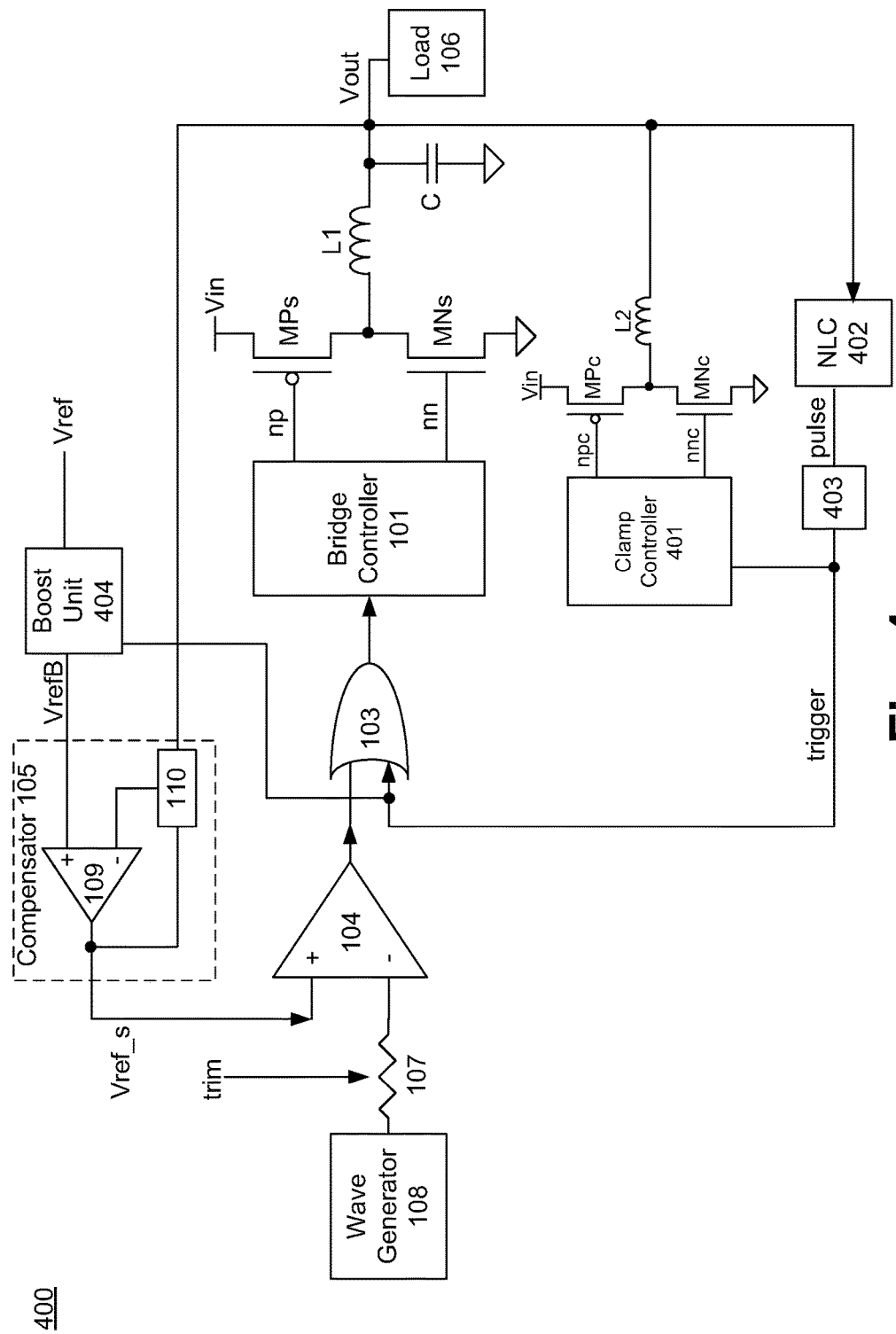
FIG. 4 is a switching VR with Direct Current (DC) and AC coupling NLC unit and clamp for voltage droop management, according to one embodiment of the disclosure.

FIG. 4 is part of an apparatus 400 of switching VR with Direct Current (DC) coupling of output voltage to NLC unit, according to one embodiment of the disclosure. It is pointed out that those elements of FIG. 4 having the same reference numbers (or names) as the elements of any other figure can operate or function in any manner similar to that described, but are not limited to such.

So as not to obscure the embodiment of FIG. 4, circuits and/or units discussed with reference to FIG. 1 and repeated in FIG. 4 are not discussed again. For example, function and description of Bridge Controller 101, high-side switch MPs, low-side switch MNs, main inductor L1, load capacitor C, Load 106, Override logic 103, Comparator 104, Compensator 105, circuit 107 for trimming modulated wave, and Wave Generator 108, are not discussed in detail again. These circuits and/or logic units operate the same way as discussed with reference to FIG. 1.

Referring back to FIG. 4, in one embodiment, apparatus 400 comprises clamp controller 401, clamp high-side switch MPc, clamp low-side switch MNc, clamp inductor L2, NLC unit 402 with DC coupling, phase conditioner 403 (optional), and boost unit 404. In one embodiment, clamp low-side switch MNc is replaced with a diode. In such an embodiment, low-side switch MNs is also replaced with a diode. In one embodiment, Clamp Controller 401, clamp high-side switch MPc, clamp low-side switch MNc, clamp inductor L2 are similar in design and layout of Bridge Controller 101, high-side switch MPs, low-side switch MNs, and main inductor L1, but smaller in size. For example, Clamp Controller 401 has the same logic as Bridge Controller 101, but is 'x' times smaller in size (e.g., 4 times smaller) than Bridge Controller 101, clamp high-side switch MPc is same as high-side switch MPs, but 'x' times smaller in size (e.g., 4 times smaller).

In one embodiment, Clamp Controller 401 is driven by output of NLC 402. For example, trigger signal (which is a pulse signal) causes Clamp Controller 401 to turn on clamp high-side switch MPc when voltage droop is detected on Vout. In such an embodiment, high clamp high-side switch MPc pulls output voltage Vout up from its droop level faster than MPs alone which is also turned on in response to trigger signal indicating a voltage droop. In one embodiment, during voltage droop (i.e., during the pulse duration of trigger signal), clamp low-side switch MNc is turned off. In one embodiment, clamp low-side switch MNc is turned off for normal load conditions too. In one embodiment, clamp low-side switch MNc may turn on briefly after clamp high-side switch MPc turns off.

In one embodiment, pulse width of output pulse of NLC 402 is adjusted by Pulse Conditioner 403 (also called Pulse Adjuster) to adjust the duration of clamping of Vout by clamp high-side switch MPc and high-side switch MPs. In one embodiment, pulse width of output pulse of NLC 102 of FIG. 1 is also adjusted by Pulse Conditioner 402 (not shown in FIG. 1). In one embodiment, output of Pulse Conditioner 403 (i.e., trigger signal) is received by Boost Unit 404. In one embodiment, Boost Unit 404 temporarily raises VrefB relative to Vref in response to trigger signal indicating a voltage droop. In one embodiment, when droop is over, Boost Unit 404 causes VrefB to be substantially equal to Vef. While the embodiment of FIG. 1 does not show Boost Unit 404, Boost Unit 404 can be used in apparatus 100 of FIG. 1 just like it is shown in FIG. 4. One technical effect of Boost Unit 404 is that it raises Vout from its droop level to a stable normal level with little noise so that NLC 402 is not fired up frequently. When NLC 402 is not fired up frequently, clamp controller keeps clamp high-side switch MPc and clamp low-side switch MNc in tri-state through control signals npc and nnc.

Figure 5:
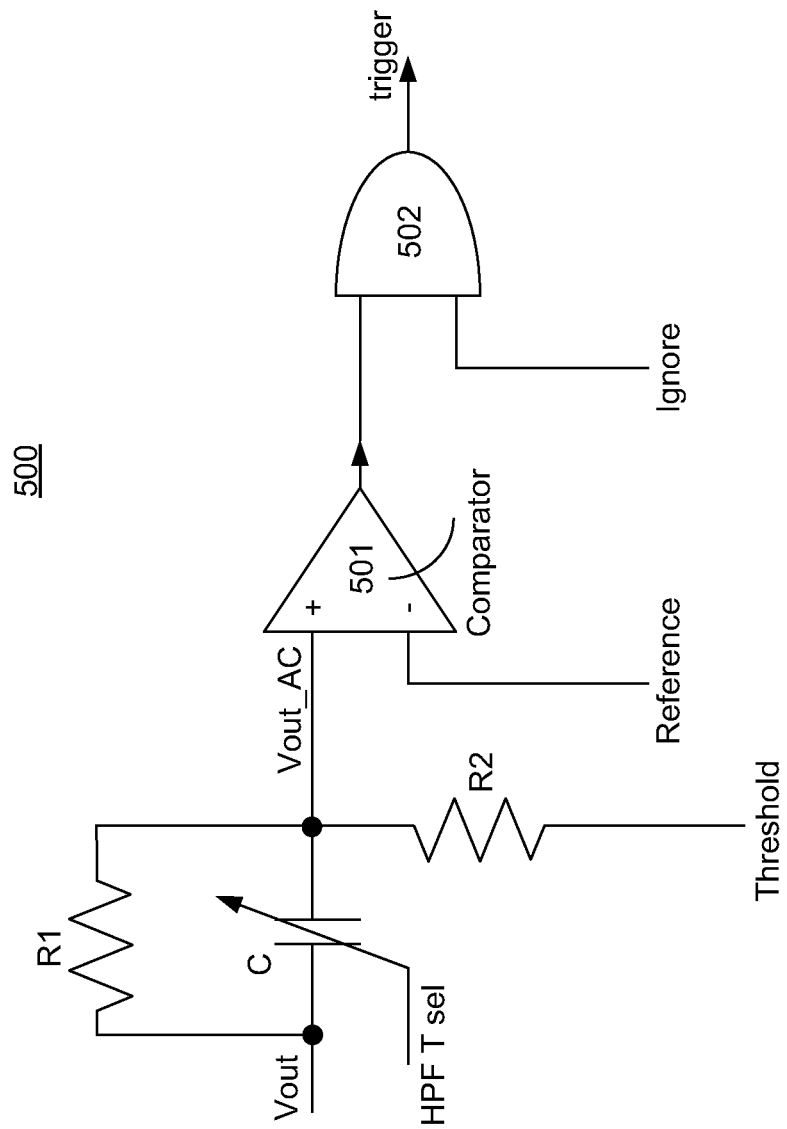
FIG. 5 is an NLC unit with AC and DC coupling of output voltage, according to one embodiment of the disclosure.

FIG. 5 is an NLC unit 500 (e.g., 402) with DC and AC coupling of output voltage, according to one embodiment of the disclosure. It is pointed out that those elements of FIG. 5 having the same reference numbers (or names) as the elements of any other figure can operate or function in any manner similar to that described, but are not limited to such.

In one embodiment, NLC unit 500 comprises comparator 501, Bypass Unit 502 (which operates similar to Bypass Unit 202 of FIG. 2), HPF formed from capacitor C and resistor R2, and resistor R1. In one embodiment, capacitor C AC couples Vout to input (Vout_AC) of Comparator 501. In one embodiment, resistor R1 DC couples Vout to input (Vout_AC) of Comparator 501. The DC coupling allows Vout_AC to be comparable (e.g., by finite DC level) to reference voltage Vref_s to Comparator 104.

In one embodiment, NLC unit 500 further comprises a multiplexer or logic (not shown) to override the output of Comparator 501 and/or Bypass Unit 502. In such an embodiment, output from another logic (or external pin) indicating that voltage droop on Vout is about to occur is used to generate the trigger signal for voltage droop management. For example, a prediction logic (not shown) may predict or anticipate current demand increase by Load 106, and provide a signal to the multiplexer or logic to override output of Comparator 501 and/or Bypass Unit 502. In such an embodiment, Bridge Controller 101 is forced to turn on high-side switch MPs prior to voltage droop on Vout or just about when voltage droop on Vout is about to occur. In one embodiment, the same behavior (i.e., forcefully turning off devices prior to voltage droop on Vout) may also be applied to MPc or both MPs and MPc simultaneously. This proactive voltage droop management may cause overshoot on output voltage Vout (because high-side switch MPs is forcefully turned on), which is less disruptive to operation of circuits of load 106 than voltage droop on output voltage Vout.

Figure 6:
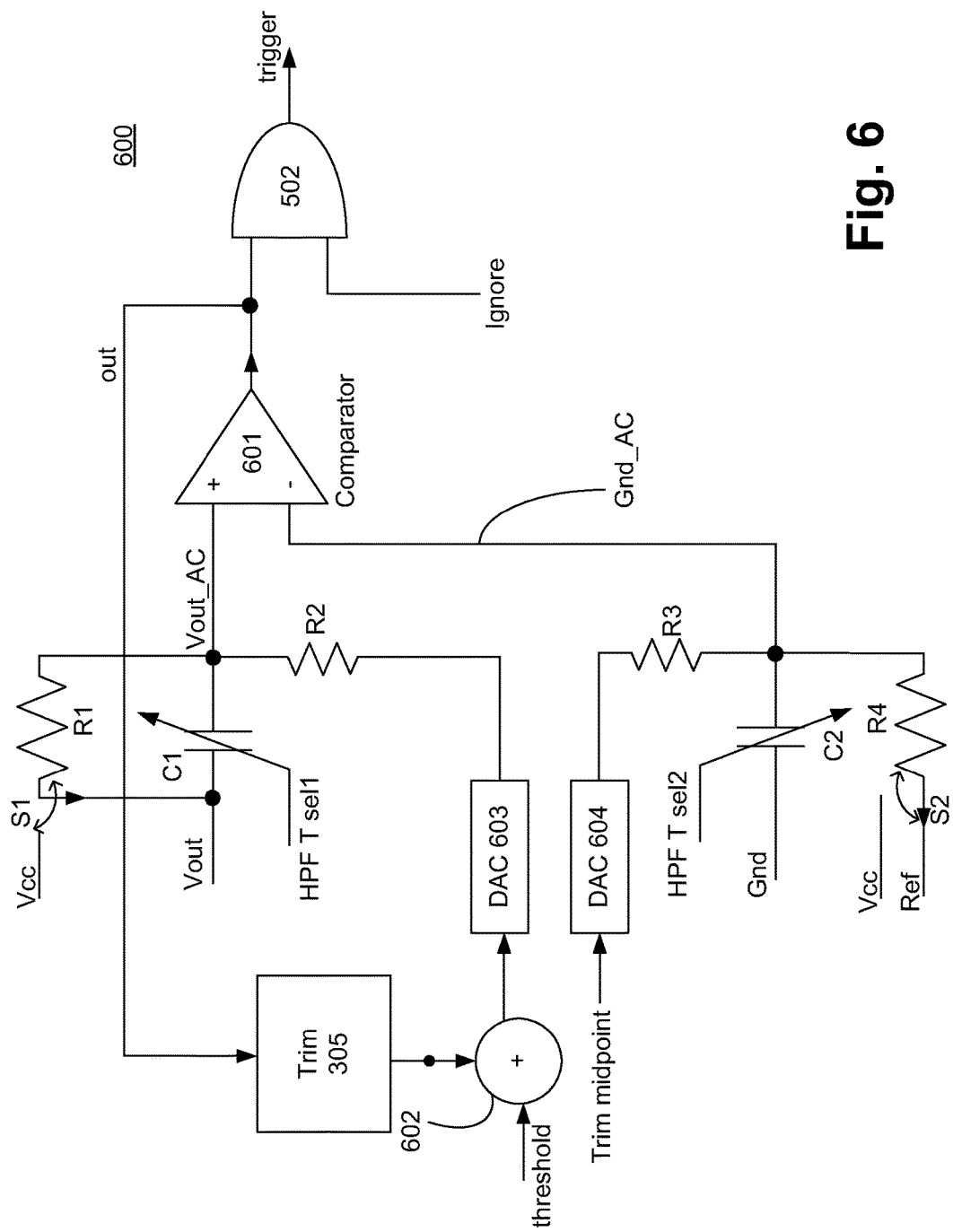
FIG. 6 is an NLC unit with differential AC and DC coupling of output voltage, according to one embodiment of the disclosure.

FIG. 6 is an NLC unit 600 with differential AC and DC coupling output voltage, according to one embodiment of the disclosure. It is pointed out that those elements of FIG. 6 having the same reference numbers (or names) as the elements of any other figure can operate or function in any manner similar to that described, but are not limited to such.

In one embodiment, NLC 600 comprises Comparator 601, Adder 602, DAC 603, DAC 604, and Trim logic 305. In this embodiment, both Vout and ground (Gnd) are AC and DC coupled to inputs of Comparator 601 (which otherwise is similar to Comparator 501). In one embodiment, two HPFs (first HPF and second HPF) are used to generate the AC and DC coupled inputs for Comparator 601. One technical effect of NLC unit 600 is that NLC unit 600 exhibits double signal to noise ratio (SNR) compared to NLC unit 500 because ground noise is also modeled in the decision process of generating trigger signal. The embodiments of FIG. 5 and FIG. 6 provide DC coupling of Vout to Vout_AC with AC boost.

In one embodiment, first HPF comprises capacitor C1, resistor R1 and resistor R2. In this embodiment, resistor R1 is used to DC couple Vout or Vcc to node Vout_AC while capacitor C1 is used to AC couple Vout to Vout_AC. In one embodiment, switch S1 (e.g., pass gate) is used to couple Vcc or Vout to Vout_AC. In one embodiment, capacitor C1 provides phase lead to improve stability of the control loop. In one embodiment, capacitance of capacitor C1 is programmable by HPF T sell signal. In one embodiment, HPF T sell signal is generated by fuse. In other embodiments, HPF T sell signal is programmable by software. In one embodiment, one terminal of resistor R2 is coupled to Vout_AC and the other terminal of resistor R2 is coupled to DAC 603.

In one embodiment, DAC 603 converts threshold bits to an analog representation. In one embodiment, Adder 602 adds offset trim values of Comparator 601 with threshold bits to provide digital input for DAC 603. In one embodiment, Adder 602 is a digital adder. In one embodiment, the resistors and capacitors of first and second HPFs (i.e., R1, R2, R3, R4, C1, and C2) are trimmed by trim logic 305 according to output out of Comparator 601. In one embodiment, RC trim behavior is same as for Controller 300. As in FIG. 3, Trim logic 305 of FIG. 6 is used for trimming comparator offset. The same offset trim approach as discussed with reference to FIG. 3 is applied to 600.

The "trim midpoint" is the maximum trim code from 305 divided by two. This allows us to trim both positive and negative offset in the comparator. This behavior is also used in apparatus 300 of FIG. 3 by shifting the reference to DAC 304 by the trim midpoint. In one embodiment, threshold bits are 5 bits in 8 mV increments. In other embodiments, other number of bits and granularity may be used.

In one embodiment, second HPF comprises capacitor C2, resistor R3, and resistor R4. In this embodiment, capacitor C2 is used to AC couple Gnd to Gnd_AC. In one embodiment, resistor R4 is used to DC couple a reference voltage (Ref) or power supply (Vcc) to Gnd_AC. In one embodiment, switch S2 (e.g., pass gate) is used to couple Vcc or Ref to Gnd_AC. In one embodiment, when switch S1 couples resistor R2 to Vcc and switch S2 couples resistor R2 to Vcc, then NLC unit 600 operates with AC coupling mode in which output voltage is AC coupled to Comparator 601 through capacitor C1. In one embodiment, when switch S1 couples resistor R1 to Vout and switch S2 couples resistor R2 to Ref, then NLC unit 600 operates with AC and DC coupling modes in which output voltage is AC and DC coupled to Comparator 601 through capacitor C1.

In one embodiment, second HPF allows high frequency noise to be modulated in decision making. One technical effect of the second HPF is that it provides immunity from common mode noise on sense lines (i.e., nodes Vout_AC and Gnd_AC) to Comparator 601. In one embodiment, the time constants for the first and second HPFs are 1ns to 8 ns. In other embodiments, other time constants may be used.

In one embodiment, capacitance of C2 is programmable by HPF T sel2 signal. In one embodiment, both C1 and C2 are programmable to provide variable HPF time constant. In one embodiment, the same signal is used for programming both C1 and C2 to provide the same time constants for both filters. In other embodiment, different signals are used for programming both C1 and C2 to provide the same time constants for both filters. In one embodiment, HPF T sel2 signal is generated by fuse. In other embodiments, HPF T sel2 signal is programmable by software. In one embodiment, one terminal of resistor R3 is coupled to Gnd_AC and the other terminal of resistor R3 is coupled to DAC 604. In one embodiment, DAC 604 converts RC trim bits to analog representation.

In one embodiment, NLC unit 600 further comprises a multiplexer or logic (not shown) to override the output of Comparator 501 and/or Bypass Unit 502. In such an embodiment, output from another logic indicating that voltage droop on Vout is about to occur is used to generate the trigger signal for voltage droop management. For example, a Prediction logic (not shown) may predict or anticipate current demand increase by Load 106, and provide a signal to the multiplexer or logic to override output of Comparator 501 and/or Bypass Unit 502. In such an embodiment, Bridge Controller 101 is forced to turn on high-side switch MPs prior to voltage droop on Vout or just about when voltage droop on Vout is about to occur. In one embodiment, the same behavior (i.e., forcefully turning off devices) may also be applied to clamp high-side switch MPc or both high-side switch MPs and clamp high-side switch MPc simultaneously. This proactive voltage droop management may cause overshoot on output voltage Vout (because high-side switch MPs is forcefully turned on), which is less disruptive to operation of circuits of load 106 than voltage droop on output voltage Vout.

Figure 7:
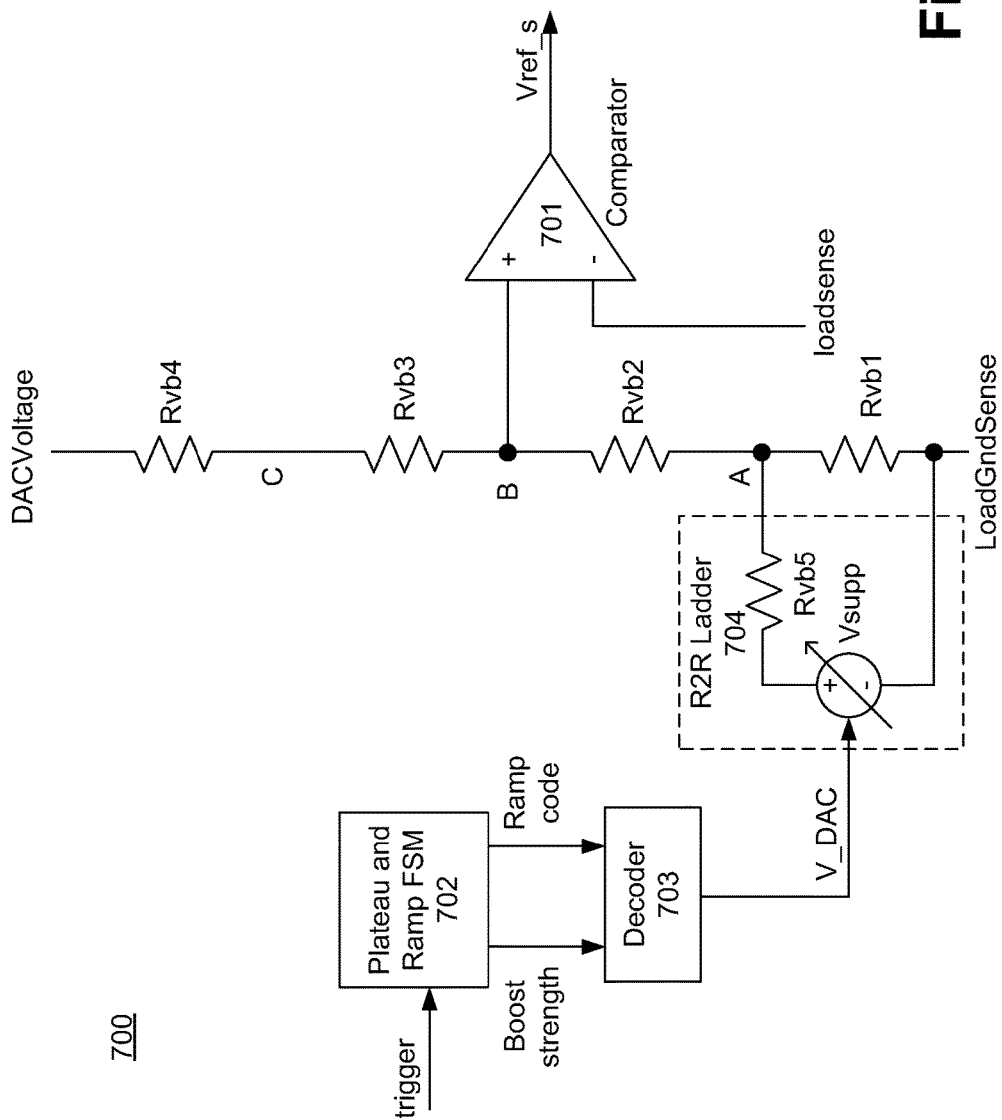
FIG. 7 is a boost unit for voltage droop management, according to one embodiment of the disclosure.

FIG. 7 is an apparatus 700 with a Boost Unit (e.g., 404) and part of compensation unit 105 for voltage droop management, according to one embodiment of the disclosure. It is pointed out that those elements of FIG. 7 having the same reference numbers (or names) as the elements of any other figure can operate or function in any manner similar to that described, but are not limited to such.

In one embodiment, Compensation Unit 105 comprises Comparator 701 (e.g., 109), and resistors Rbv1, Rbv2, Rvb3, and Rvb4 which form part of passive components 110. In one embodiment, Comparator 701 is same as Comparator 109. In one embodiment, Comparator 701 generates Vref_s for Comparator 104. In one embodiment, LoadGnd-Sense node is a ground node physically near Load 106. While the embodiments illustrate node B tapped as input to Comparator 701, other nodes (e.g., nodes A and C) can also be selectively coupled to Comparator 701. In one embodiment, Comparator 701 also receives input loadsense (i.e., Vout at Load 106).

In one embodiment, Boost Unit 404 comprises plateau and ramp finite state machine (FSM) 702, Decoder 703, and R2 R Ladder 704. In one embodiment, FSM 702 receives trigger signal from NLC units 102 or 402 (or from Phase Adjuster 403) to generate boost strength code and boost ramp code. In one embodiment, Decoder 703 is coupled to FSM 701 and R2 R Ladder 704. In one embodiment, Decoder 703 receives boost strength and boost ramp codes and generates a code (V_DAC) for R2 R Ladder 704.

In one embodiment, outputs of FSM 702 indicate the plateau magnitude as "boost strength" and the time state (i.e. whether we're at the plateau or a state in the ramp) of the output as the "ramp code." In one embodiment, Decoder 703 merges these signals (i.e., boost strength and ramp code) into one digital code used by the DAC. In one embodiment, FSM 702 and Decoder 703 may be merged into one block that receives the trigger signal and generates code V_DAC.

In one embodiment, R2 R Ladder 704 comprises a variable supply Vsupp coupled to resistor Rvb5, where one terminal of resistor Rvb5 is coupled to node A and the other terminal of resistor Rvb5 is coupled to Vsupp. While the embodiment shows R2 R Ladder 704 coupled to node A, it can also be coupled to node B, or C. In one embodiment, Rbv1 is approximately equal to (Rvb5)/6 which is approximately equal to (Rvb2+Rvb3)/25. In one embodiment, Rvb4 is equal to (Rvb1||Rvb5)/2. In this embodiment, DACVoltage is equivalent to Vref in apparatus 100 and 400.

Figure 8:
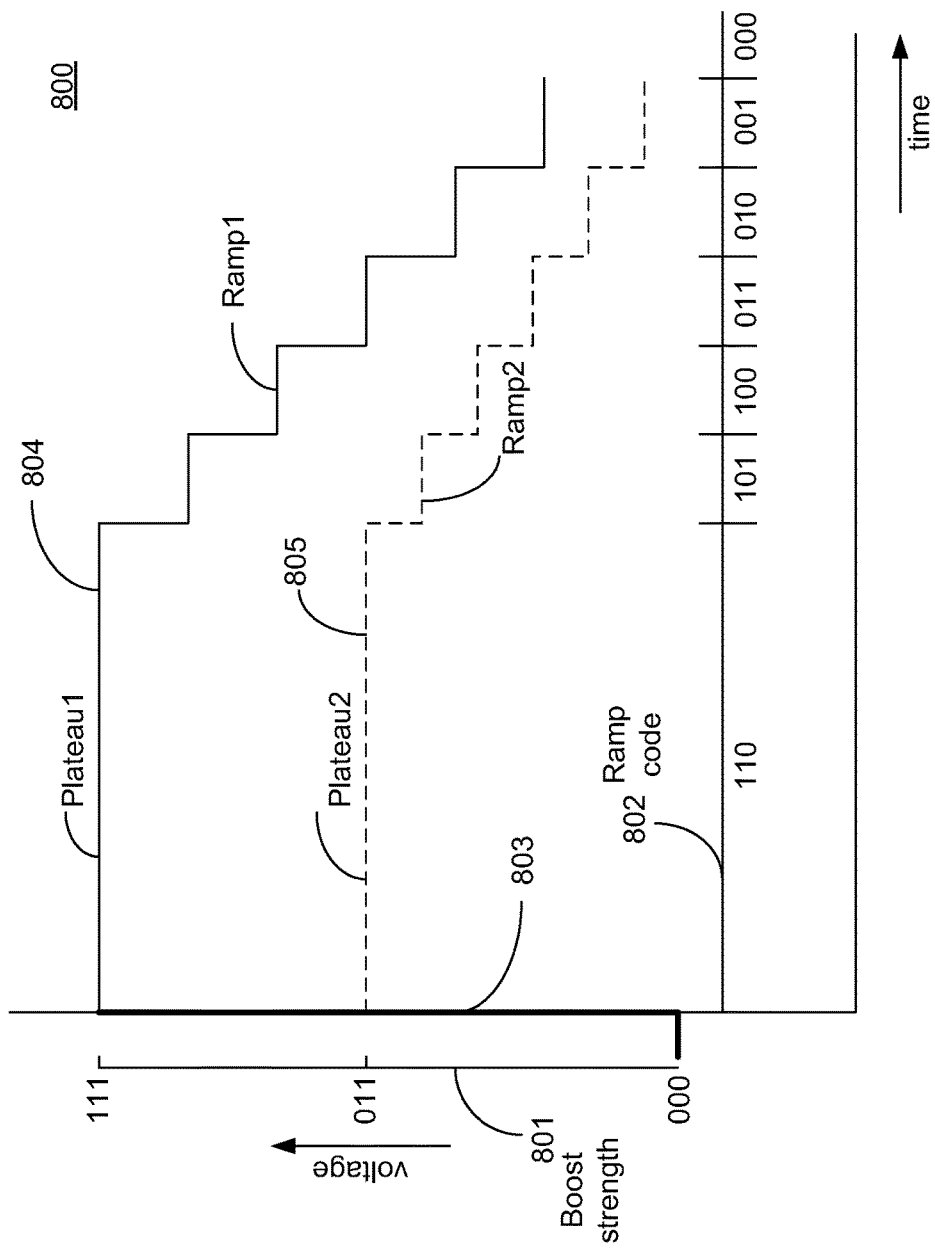
FIG. 8 illustrates operation of the boost unit, according to one embodiment of the disclosure.

FIG. 8 is a plot 800 showing operation of the boost unit 404, according to one embodiment of the disclosure. It is pointed out that those elements of FIG. 8 having the same reference numbers (or names) as the elements of any other figure can operate or function in any manner similar to that described, but are not limited to such.

The x-axis of plot 800 is time while y-axis is voltage. Superimposed on plot 800 are Boost strength code 801 (on y-axis) and ramp code 802 (on x-axis). Depending on the output of FSM 702, initial Boost strength 803 may result in Plateau1(e.g., at 70 mV) or Plateau2 (e.g., at 35 mV) or other Plateaus not shown. In this example, Boost strength code 011 corresponds to Plateau2 and Boost strength code 111 corresponds to Plateau1.

Waveforms 804 and 805 are two different boost behaviors for illustration purposes. In one embodiment, Plateau1 or Plateau2 has duration of 20-30 ns. In other embodiments, other durations may be programmed. In one embodiment, Ramp code 802 is a three bit code with 10 ns step size. In other embodiments, other bit codes and step sizes may be used.

Figure 9:
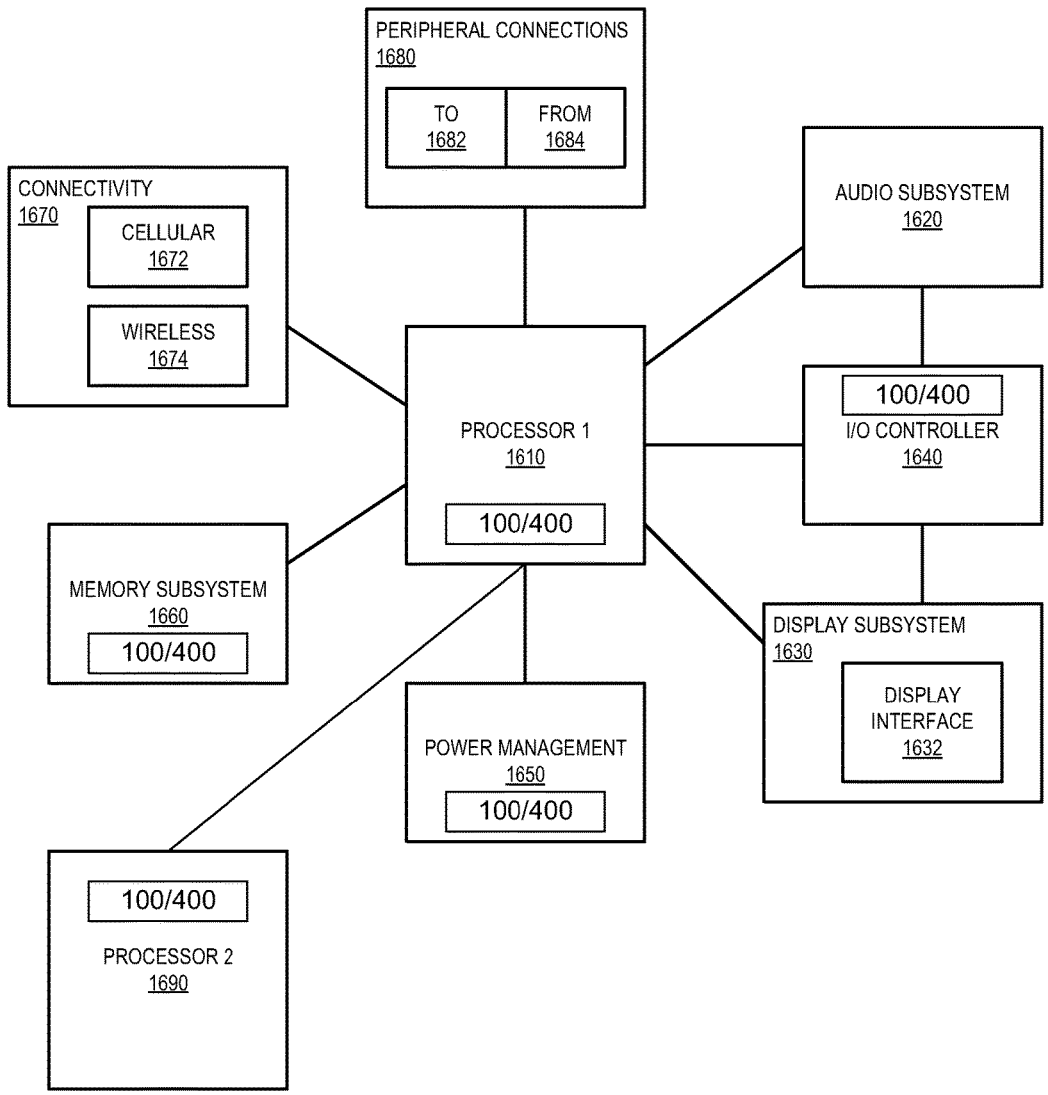
FIG. 9 is a smart device or a computer system or an SoC (system-on-chip) with switching VR with DC coupling NLC unit and/or AC coupling NLC unit for voltage droop management, according to one embodiment of the disclosure.

FIG. 9 is a smart device or a computer system or an SoC (system-on-chip) 1600 with switching VR with DC coupling NLC unit and/or AC and DC coupling NLC unit for voltage droop management, according to one embodiment of the disclosure. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with switching VR with DC coupling NLC unit and/or AC and DC coupling NLC unit for voltage droop management, according to the embodiments discussed. Other blocks of the computing device 1600 may also include the switching VR with DC coupling NLC unit and/or AC and DC coupling NLC unit for voltage droop management discussed in the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus comprises: a first inductor for coupling to a load; a capacitor, coupled to the first inductor, and for coupling to the load; a first high-side switch coupled to the first inductor; a first low-side switch coupled to the first inductor; a bridge controller to control when to turn on and off the first high-side and first low-side switches; and an NLC unit to monitor output voltage on the load, and to cause the bridge controller to turn on the first high-side switch and turn off the first low-side switch when a voltage droop is detected on the load.

In one embodiment, the apparatus further comprises a logic unit operable to override output of a comparator to control the bridge controller. In one embodiment, the apparatus further comprises: a second inductor or resistor, coupled to the capacitor, and for coupling to the load; a second high-side switch coupled to the second inductor or resistor; and a clamp controller to control when to turn on and off the second high-side switch. In one embodiment, the apparatus further comprises: a second low-side switch coupled to the second inductor. In one embodiment, the second inductor, second high-side switch, second low-side switch, and clamp controller are smaller in size than the first inductor, first high-side switch, first low-side switch, and bridge controller respectively.

In one embodiment, the NLC unit is coupled to the clamp controller. In one embodiment, the apparatus further comprises a pulse adjuster to adjust pulse width of an output of the NLC unit, wherein the pulse adjuster is coupled to the clamp controller. In one embodiment, the apparatus further comprises a compensator to adjust reference voltage to the comparator according to the output voltage on the load.

In one embodiment, the apparatus further comprises a voltage boost unit coupled to the compensator, the voltage boost unit operable to adjust the reference voltage to the comparator in response to output of the NLC unit. In one embodiment, the voltage boost unit is operable to adjust the reference voltage of the comparator by a programmable amount according to at least one of factors of power consumption by the load and turn on activity of the second high-side switch. In one embodiment, the voltage boost unit is operable to adjust the reference voltage by increasing the reference voltage followed by gradual decreasing of the reference voltage.

In one embodiment, the NLC unit comprises: a comparator; and a network of devices forming a high pass filter to couple AC output voltage on the load to input of the comparator, wherein an output of the comparator to control the logic unit. In one embodiment, the NLC unit comprises: a comparator; and a network of devices forming a high pass filter with finite DC gain to couple AC and DC output voltage on the load to input of the comparator, wherein an output of the comparator to control the logic unit.

In one embodiment, the apparatus further comprises a wave generator to generate a signal which is received by the comparator. In one embodiment, the load is at least one of: a processor core; a graphics core; or memory. In one embodiment, the apparatus further comprises a pulse adjuster to adjust pulse width of an output of the NLC unit. In one embodiment, the apparatus further comprises: a compensator to adjust reference voltage to the comparator according to the output voltage on the load; and a voltage boost unit coupled to the compensator, the voltage boost unit operable to adjust the reference voltage to the comparator in response to output of the NLC unit.

In another example, an apparatus comprises: a bridge controller to control when to turn on and off first high-side and first low-side switches; an NLC unit to monitor output voltage on a load, and to cause the bridge controller to turn on the first high-side switch and turn off the first low-side switch when a voltage droop is detected on the load; a comparator to compare a periodic signal relative to a reference voltage; and a logic unit operable to override output of the comparator to control the bridge controller according to an output of the NLC unit. In one embodiment, the NLC unit comprises: a comparator; and a network of devices forming a high pass filter to couple AC output voltage on the load to input of the comparator, wherein an output of the comparator to control the logic unit.

In one embodiment, NLC unit comprises: a comparator; and a network of devices forming a high pass filter with finite DC gain to couple AC and DC output voltage on the load to input of the comparator, wherein an output of the comparator to control the logic unit. In one embodiment, the apparatus further comprises a voltage boost unit coupled to a compensator, the voltage boost unit operable to adjust the reference voltage to the comparator in response to output of the NLC unit.

In another example, a system comprises a memory unit; a processor coupled to the memory unit, the processor including a voltage regulator, the voltage regulator comprising: a first inductor for coupling to a load; a capacitor, coupled to the first inductor, and for coupling to the load; a first high-side switch coupled to the first inductor; a first low-side switch coupled to the first inductor; a bridge controller to control when to turn on and off the first high-side and first low-side switches; and an NLC unit to monitor output voltage on the load, and to cause the bridge controller to turn on the first high-side switch and turn off the first low-side switch when a voltage droop is detected on the load; and a wireless interface for allowing the processor to communicate with other devices.

In one embodiment, the system further comprises a display unit to display data processed by the processor. In one embodiment, the system further comprises: a second inductor or resistor, coupled to the capacitor, and for coupling to the load; a second high-side switch coupled to the second inductor or resistor; and a clamp controller to control when to turn on and off the second high-side switch.

In one embodiment, the NLC unit comprises at least one of: a network of devices forming a high pass filter to couple AC output voltage on the load to input of a comparator, wherein an output of the comparator to control a logic unit for controlling the bridge controller, or a network of devices forming a high pass filter with finite DC gain to couple AC and DC output voltage on the load to input of the comparator, wherein an output of the comparator to control the logic unit for controlling the bridge controller.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first inductor for coupling to a load;
   a capacitor, coupled to the first inductor, and for coupling to the load;
   a first high-side switch coupled to the first inductor;
   a first low-side switch coupled to the first inductor;
   a bridge controller to control when to turn on and off the first high-side and first low-side switches;
   a non-linear control (NLC) unit having an input coupled between the first inductor and the load to monitor an output voltage on the load, and an output to provide a trigger signal to cause the bridge controller to turn on the first high-side switch and turn off the first low-side switch when a droop on the output voltage is detected on the load, wherein the trigger signal is a pulse signal having a pulse width indicative of a time duration of the output voltage droop, wherein the NLC unit comprises:
   a second comparator; and a network of devices forming a high pass filter to couple Alternating Current (AC) output voltage on the load to input of the second comparator, wherein an output of the second comparator to control a second logic unit.

2. The apparatus of claim 1 further comprises:
   a second inductor or resistor, coupled to the capacitor, and for coupling to the load;
   a second high-side switch coupled to the second inductor or resistor; and
   a clamp controller to control when to turn on and off the second high-side switch.

3. The apparatus of claim 2 further comprises:
   a second low-side switch coupled to the second inductor.

4. The apparatus of claim 2, wherein the second inductor, second high-side switch, second low-side switch, and clamp controller are smaller in size than the first inductor, first high-side switch, first low-side switch, and bridge controller respectively.

5. The apparatus of claim 2, wherein the NLC unit is coupled to the clamp controller.

6. The apparatus of claim 2 further comprises a pulse adjuster to adjust a pulse width of an output of the NLC unit, wherein the pulse adjuster is coupled to the clamp controller.

7. The apparatus of claim 2 further comprises a compensator to adjust reference voltage to the comparator according to the output voltage on the load.

8. The apparatus of claim 7 further comprises a voltage boost unit coupled to the compensator, the voltage boost unit operable to adjust the reference voltage to the comparator in response to an output of the NLC unit.

9. The apparatus of claim 7, wherein the voltage boost unit is operable to adjust the reference voltage of the comparator by a programmable amount according to at least one of factors of power consumption by the load and turn on activity of the second high-side switch.

10. The apparatus of claim 7, wherein the voltage boost unit is operable to adjust the reference voltage by increasing the reference voltage followed by gradual decreasing of the reference voltage.

11. An apparatus comprising:
    a first inductor for coupling to a load;
    a capacitor, coupled to the first inductor, and for coupling to the load;
    a first high-side switch coupled to the first inductor;
    a first low-side switch coupled to the first inductor;
    a bridge controller to control when to turn on and off the first high-side and first low-side switches;
    a non-linear control (NLC) unit having an input coupled between the first inductor and the load to monitor an output voltage on the load, and an output to provide a trigger signal to cause the bridge controller to turn on the first high-side switch and turn off the first low-side switch when a droop on the output voltage is detected on the load, wherein the trigger signal is a pulse signal having a pulse width indicative of a time duration of the output voltage droop, wherein the NLC unit comprises: a second comparator; and a network of devices forming a high pass filter with finite direct current (DC) gain to couple alternating current (AC) and DC output voltage on the load to input of the second comparator, wherein an output of the second comparator to control a second logic unit.

12. The apparatus of claim 1 further comprises a wave generator to generate a signal which is received by the comparator.

13. The apparatus of claim 1, wherein the load is at least one of:
   a processor core;
   a graphics core; or
   a memory.

14. The apparatus of claim 1 further comprises a pulse adjuster to adjust a pulse width of an output of the NLC unit.

15. The apparatus of claim 1 further comprises:
   a compensator to adjust a reference voltage to the comparator according to the output voltage on the load; and
   a voltage boost unit coupled to the compensator, the voltage boost unit operable to adjust the reference voltage to the comparator in response to an output of the NLC unit.

16. An apparatus comprising:
   a bridge controller to control when to turn on and off a first high-side and a first low-side switches coupled to a load via an inductor;
   a non-linear control (NLC) unit having an input coupled between the inductor and the load to monitor an output voltage on the load, and an output to provide a trigger signal to cause the bridge controller to turn on the first high-side switch and turn off the first low-side switch when a droop on the output voltage is detected on the load, wherein the trigger signal is a pulse signal having a pulse width indicative of a time duration of the output voltage droop;
   a first comparator to compare a periodic signal relative to a reference voltage, wherein the NLC unit comprises: a second comparator; and a network of devices forming a high pass filter to couple Alternating Current (AC) output voltage on the load to input of the second comparator, wherein an output of the second comparator to control the logic unit.

17. An apparatus comprising:
   a bridge controller to control when to turn on and off a first high-side and a first low-side switches coupled to a load via an inductor;
   a non-linear control (NLC) unit having an input coupled between the inductor and the load to monitor an output voltage on the load, and an output to provide a trigger signal to cause the bridge controller to turn on the first high-side switch and turn off the first low-side switch when a droop on the output voltage is detected on the load, wherein the trigger signal is a pulse signal having a pulse width indicative of a time duration of the output voltage droop; a first comparator to compare a periodic signal relative to a reference voltage, wherein the NLC unit comprises: a second comparator; and a network of devices forming a high pass filter with finite direct current (DC) gain to couple alternating current (AC) and DC output voltage on the load to input of the second comparator, wherein an output of the second comparator to control the logic unit.

18. The apparatus of claim 16 further comprises a voltage boost unit coupled to a compensator, the voltage boost unit operable to adjust the reference voltage to the comparator in response to the output of the NLC unit.

19. A system comprising:
   a memory unit;
   a processor coupled to the memory unit, the processor including a voltage regulator, the voltage regulator comprising:
      a first inductor for coupling to a load;
      a capacitor, coupled to the first inductor, and for coupling to the load;
      a first high-side switch coupled to the first inductor;
      a first low-side switch coupled to the first inductor;
      a bridge controller to control when to turn on and off the first high-side and first low-side switches; a non-linear control (NLC) unit having an input coupled between the first inductor and the load to monitor an output voltage on the load, and an output to provide a trigger signal to cause the bridge controller to turn on the first high-side switch and turn off the first low-side switch when a droop on the output voltage is detected on the load, wherein the trigger signal is a pulse signal having a pulse width indicative of a time duration of the output voltage droop; and
   a wireless interface for allowing the processor to communicate with other devices, wherein the NLC unit comprises at least one of:
      a network of devices forming a high pass filter to couple Alternating Current (AC) output voltage on the load to input of a second comparator, wherein an output of the second comparator to control a logic unit for controlling the bridge controller, or
      a network of devices forming a high pass filter with finite direct current (DC) gain to couple AC and DC output voltage on the load to input of the second comparator, wherein an output of the second comparator to control the logic unit for controlling the bridge controller.

20. The system of claim 19 further comprises a display unit to display data processed by the processor.

21. The system of claim 19 further comprises:
   a second inductor or resistor, coupled to the capacitor, and for coupling to the load;
   a second high-side switch coupled to the second inductor or resistor; and
   a clamp controller to control when to turn on and off the second high-side switch.

22. The apparatus of claim 1, wherein the logic unit receives the output of the comparator and generates an output of the logic unit, the output of the logic unit is received by the bridge controller.

* * * * *